(12) United States Patent
Deshpande et al.

(10) Patent No.: US 10,847,711 B2
(45) Date of Patent: Nov. 24, 2020

(54) METHODS OF MANUFACTURING INTEGRATED CIRCUITS USING ISOTROPIC AND ANISOTROPIC ETCHING PROCESSES

(71) Applicant: Everspin Technologies, Inc., Chandler, AZ (US)

(72) Inventors: Sarin A. Deshpande, Chandler, AZ (US); Jon Slaughter, Slingerlands, NY (US); Cong Hai, Singapore (SG); Hyunwoo Yang, Singapore (SG); Naganivetha Thiyagarajah, Singapore (SG); Shukai Ye, Singapore (SG)

(73) Assignee: Everspin Technologies, Inc., Chandler, AZ (US)

( * ) Notice: Subject to any disclaimer, the term of this patent is extended or adjusted under 35 U.S.C. 154(b) by 0 days.

(21) Appl. No.: 16/202,496

(22) Filed: Nov. 28, 2018

(65) Prior Publication Data
US 2019/0173004 A1 Jun. 6, 2019

Related U.S. Application Data

(60) Provisional application No. 62/594,229, filed on Dec. 4, 2017.

(51) Int. Cl.
| | | |
|---|---|---|
| *H01L 43/12* | (2006.01) | |
| *H01L 43/10* | (2006.01) | |
| *H01L 43/02* | (2006.01) | |
| *H01L 27/22* | (2006.01) | |

(52) U.S. Cl.
CPC .......... *H01L 43/12* (2013.01); *H01L 27/228* (2013.01); *H01L 43/02* (2013.01); *H01L 43/10* (2013.01)

(58) Field of Classification Search
CPC .......... H01L 43/12; H01L 43/02; H01L 43/10
See application file for complete search history.

(56) References Cited

U.S. PATENT DOCUMENTS

| | | |
|---|---|---|
| 8,686,484 B2 | 4/2014 | Whig et al. |
| 8,747,680 B1 | 6/2014 | Deshpande et al. |
| 9,023,216 B2 | 5/2015 | Kochergin et al. |
| 9,136,464 B1 | 9/2015 | Whig et al. |
| 9,419,208 B2 | 8/2016 | Whig et al. |
| 2016/0225981 A1 | 8/2016 | Deshpande et al. |
| 2017/0062699 A1 | 3/2017 | Huang et al. |
| 2017/0125663 A1 | 5/2017 | Nagel et al. |
| 2017/0345869 A1* | 11/2017 | Park ...................... H01L 27/222 |

OTHER PUBLICATIONS

Materials chemistry for low-k materials, Materialstoday, vol. 9, Issue 3, Mar. 2006, pp. 22-31.
International Search Report and Written Opinion issued in International Application No. PCT/US2018/062741, dated Mar. 25, 2019 (14 pages).

* cited by examiner

*Primary Examiner* — Selim U Ahmed
*Assistant Examiner* — Evan G Clinton
(74) *Attorney, Agent, or Firm* — Bookoff McAndrews, PLLC

(57) ABSTRACT

A method of fabricating a magnetoresistive device includes etching a magnetoresistive stack using a first etching process to form one or more sidewalls, and etching the stack using a second etching process after forming the one or more sidewalls. Wherein, the second etching process may be relatively more isotropic than the first etching process.

20 Claims, 7 Drawing Sheets

METHODS OF MANUFACTURING INTEGRATED CIRCUITS USING ISOTROPIC AND ANISOTROPIC ETCHING PROCESSES

CROSS-REFERENCE TO RELATED APPLICATIONS

This application claims the benefit of priority from U.S. Provisional Application No. 62/594,229, filed on Dec. 4, 2017, which is incorporated by reference herein in its entirety.

TECHNICAL FIELD

The present disclosure relates to, among other things, embodiments and aspects related to the manufacturing of an integrated circuit device and the devices resulting therefrom.

INTRODUCTION

There are many inventions described and illustrated herein, as well as many aspects and embodiments of those inventions. In one aspect, the present disclosure relates to methods of manufacturing an integrated circuit device and the devices resulting therefrom. To describe aspects of the disclosed method, an exemplary method of manufacturing a magnetoresistive device (for example, a magnetoresistive memory, magnetoresistive sensor/transducer, etc.) from a magnetoresistive stack/structure is described herein. However, this is only exemplary, and the disclosed method can be applied to manufacture any integrated circuit device.

BRIEF DESCRIPTION OF THE DRAWINGS

Embodiments of the present disclosure may be implemented in connection with aspects illustrated in the attached drawings. These drawings show different aspects of the present disclosure and, where appropriate, reference numerals illustrating like structures, components, materials and/or elements in different figures are labeled similarly. It is understood that various combinations of the structures, components, and/or elements, other than those specifically shown, are contemplated and are within the scope of the present disclosure.

For simplicity and clarity of illustration, the figures depict the general structure and/or manner of construction of the various described embodiments, as well as associated methods of manufacture. For ease of illustration, the figures depict the different regions along the thickness of the illustrated stacks as a layer having well defined boundaries with straight edges (e.g., depicted using lines). However, one skilled in the art would understand that, in reality, at an interface between adjacent regions or layers, the materials of these regions may alloy together, or migrate into one or the other material, and make their boundaries ill-defined or diffuse. That is, although multiple layers with distinct interfaces are illustrated in the figures, in some cases, over time and/or exposure to high temperatures, materials of some of the layers may migrate into or interact with materials of other layers to present a more diffuse interface between these layers. Further, although the figures illustrate each region or layer as having a relatively uniform thickness across its width, one of ordinary skill in the art would recognize that, in reality, the different regions may have a non-uniform thickness (e.g., the thickness of a layer may vary along the width of the layer), and/or the thickness of one region or layer may differ relative to the thickness of another (e.g., adjacent) region or layer.

In the figures and description, details of well-known features (e.g., interconnects, etc.) and manufacturing techniques (e.g., deposition techniques, etching techniques, etc.) may be omitted for the sake of brevity (and to avoid obscuring other features), since these features/technique are well known to those of ordinary skill in the art. Elements in the figures are not necessarily drawn to scale. The dimensions of some features may be exaggerated relative to other features to improve understanding of the exemplary embodiments. Cross-sectional views are simplifications provided to help illustrate the relative positioning of various regions/layers and to describe various processing steps. One skilled in the art would appreciate that the cross-sectional views are not drawn to scale and should not be viewed as representing proportional relationships between different regions/layers. Moreover, while certain regions/layers and features are illustrated with straight 90-degree edges, in reality, such regions/layers may be more "rounded" and/or gradually sloping. It should also be noted that, even if it is not specifically mentioned, aspects described with reference to one embodiment may also be applicable to, and may be used with, other embodiments.

Figure 1:
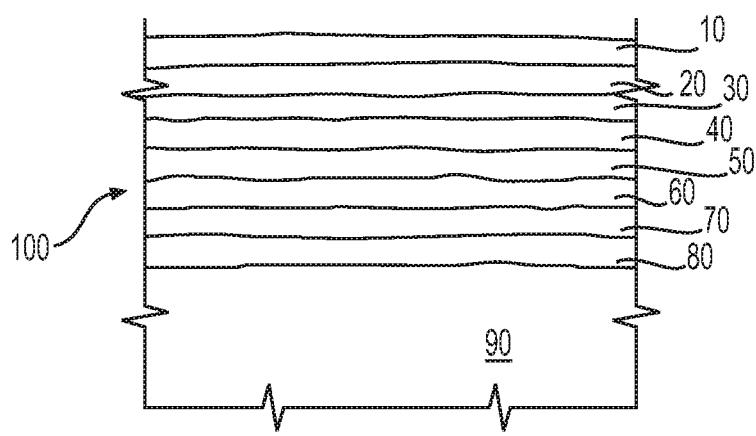
Figure 2:
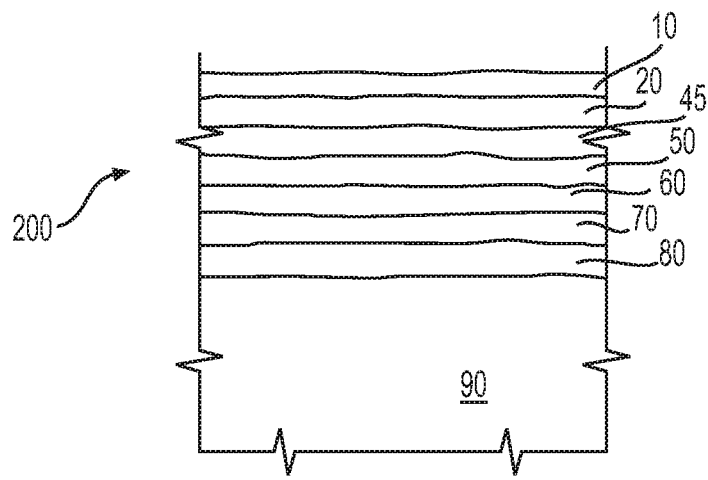
Figure 3:
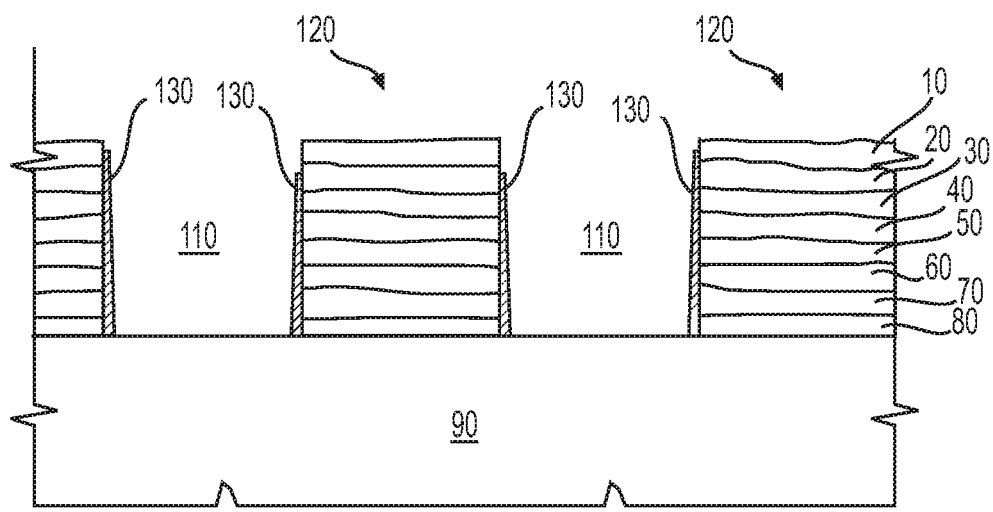
Figure 4:
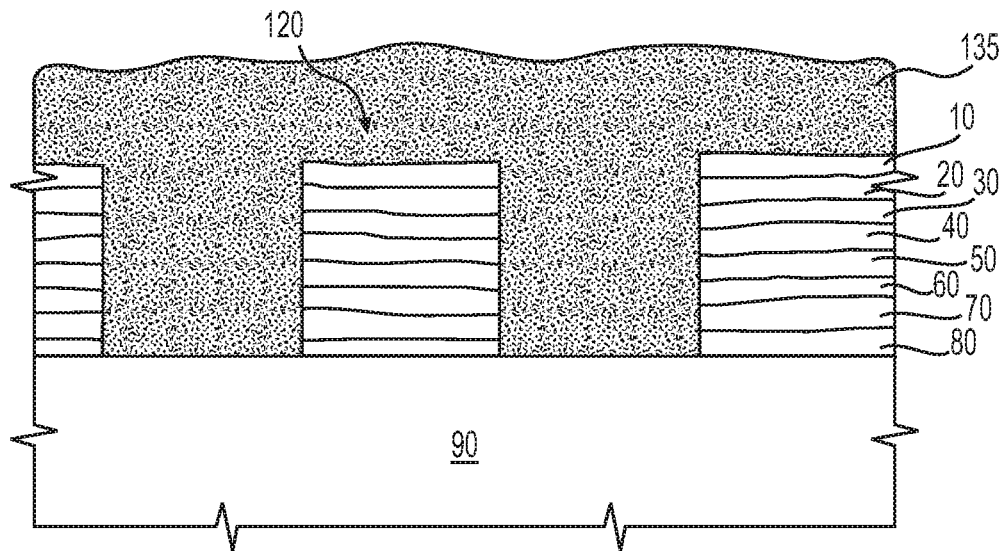
Figure 6:
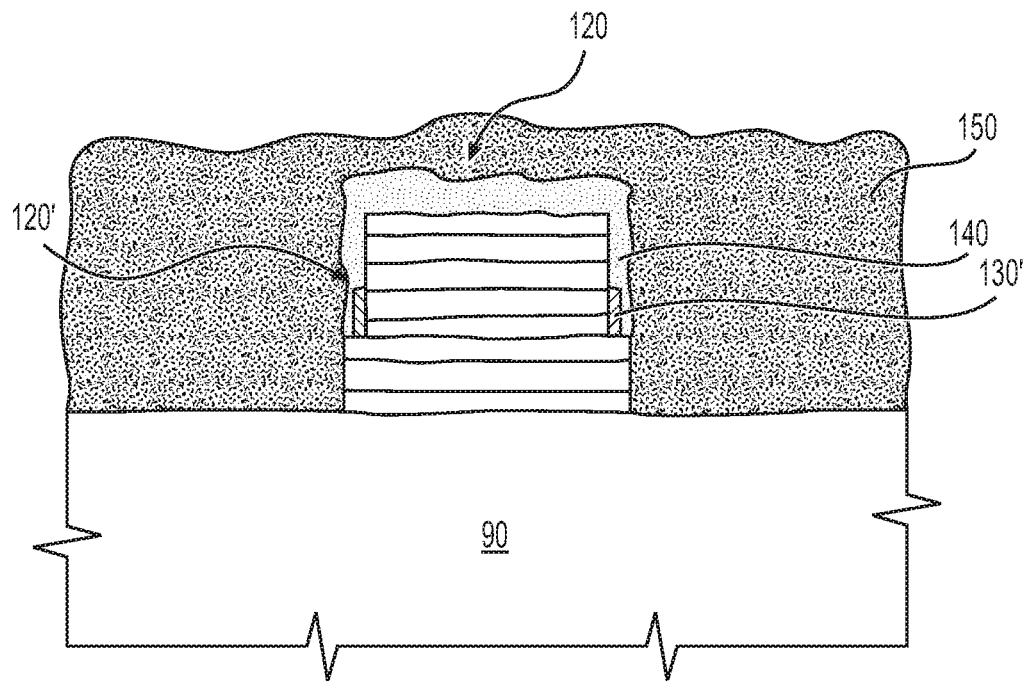
Figure 7:
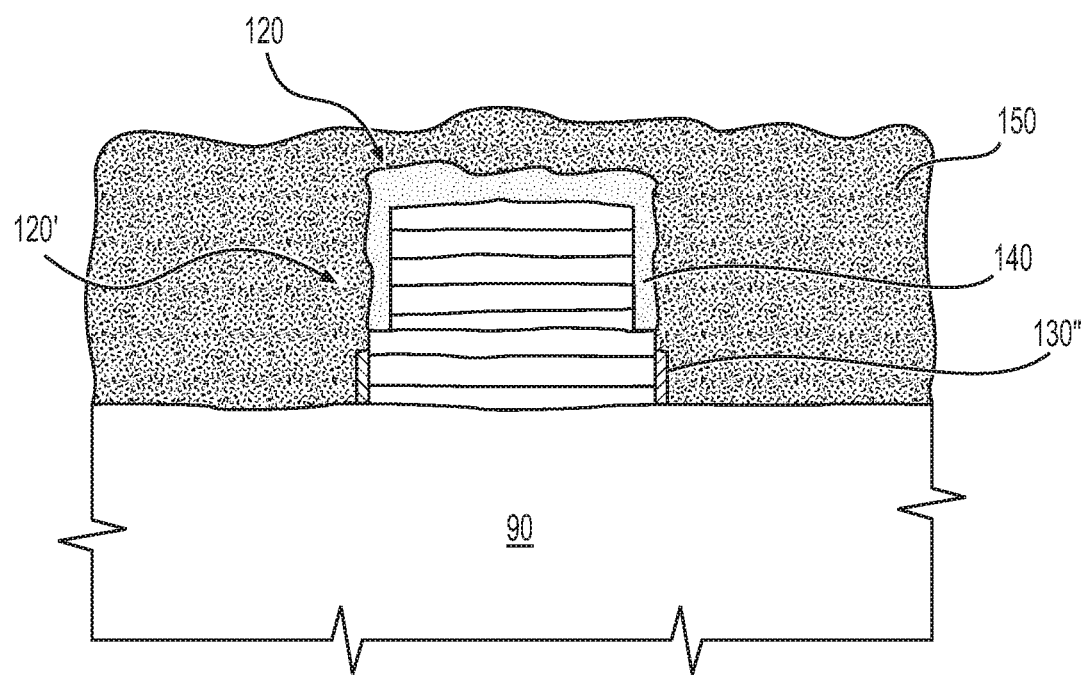
Figure 9A:
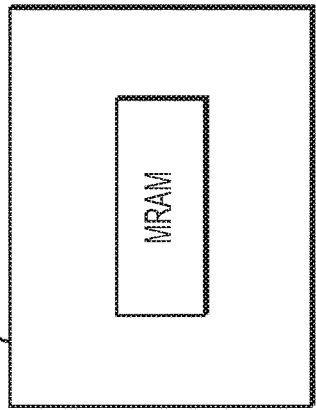
Figure 9B:
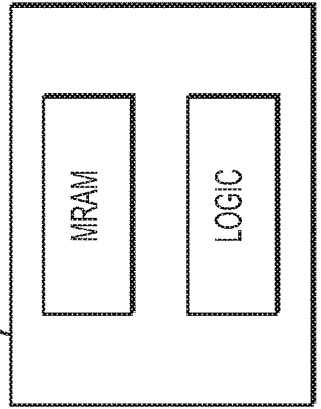
Figure 8:
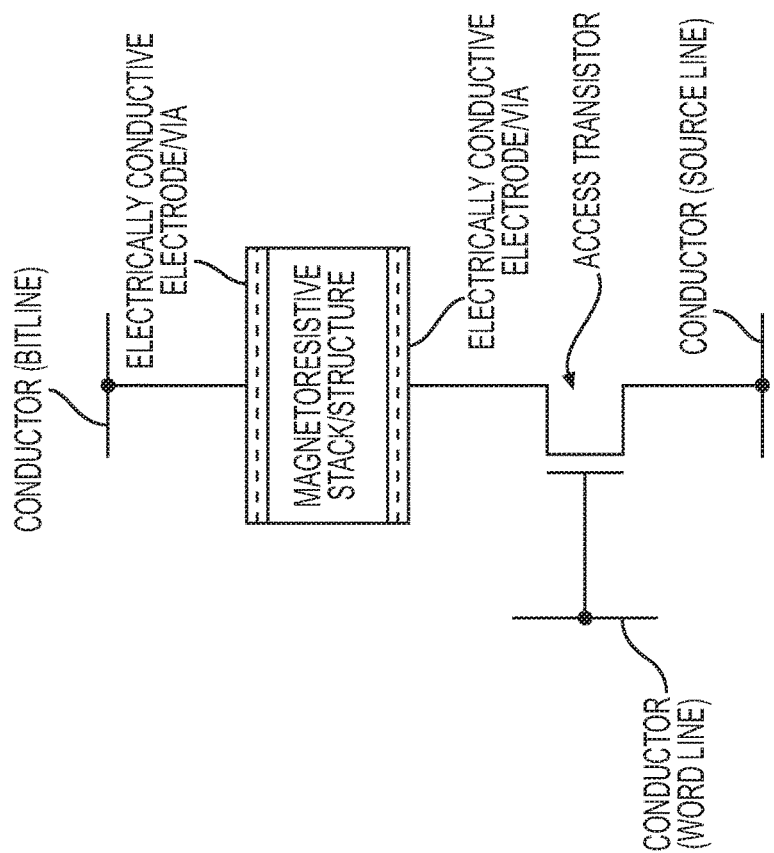
Figure 10:
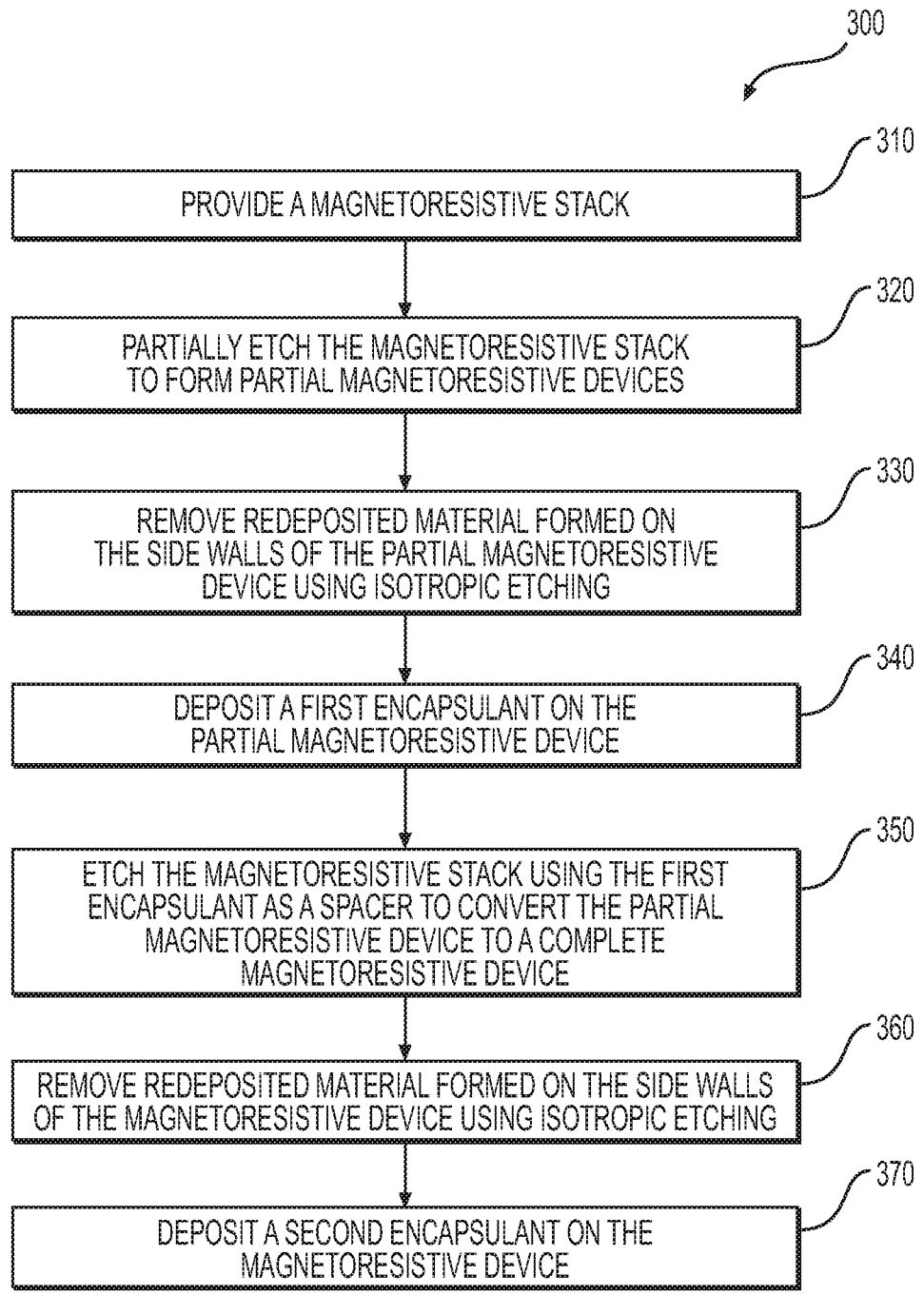

FIG. 1 is a cross-sectional schematic illustration of the structure of an exemplary magnetoresistive stack/structure of the current disclosure;

FIG. 2 is a cross-sectional schematic illustration of the structure of another exemplary magnetoresistive stack/structure of the current disclosure;

FIG. 3 is a cross-sectional illustration of the magnetoresistive stack/structure of FIG. 1 after an exemplary process step during the fabrication of an exemplary magnetoresistive device;

FIG. 4 is a cross-sectional schematic illustration of an exemplary magnetoresistive device formed from the magnetoresistive stack/structure of FIG. 1;

FIGS. 5A-5E are cross-sectional schematic illustrations of the magnetoresistive stack/structure of FIG. 1 after various process steps during the fabrication of an exemplary magnetoresistive device;

FIG. 6 is a cross-sectional schematic illustration of the magnetoresistive stack/structure of FIG. 1 after an exemplary process step during the fabrication of another exemplary magnetoresistive device;

FIG. 7 is a cross-sectional schematic illustration of the magnetoresistive stack/structure of FIG. 1 after an exemplary process step during the fabrication of yet another exemplary magnetoresistive device;

FIG. 8 is a schematic diagram of an exemplary magnetoresistive memory element electrically connected in a magnetoresistive memory cell configuration;

FIG. 9A is a schematic block diagram illustrating an exemplary discrete memory device that includes an exemplary memory element of the current disclosure;

FIG. 9B is a schematic block diagram illustrating an exemplary embedded memory device that includes a memory element of the current disclosure; and FIG. 10 is a flow chart that illustrates an exemplary manufacturing flow (or process/method) for the formation of an exemplary magnetoresistive device, according to the present disclosure.

There are many embodiments described and illustrated herein. The present disclosure is neither limited to any single aspect nor embodiment thereof, nor to any combinations and/or permutations of such aspects and/or embodiments.

Each of the aspects of the present disclosure, and/or embodiments thereof, may be employed alone or in combination with one or more of the other aspects of the present disclosure and/or embodiments thereof. For the sake of brevity, many of those combinations and permutations are not discussed separately herein.

DETAILED DESCRIPTION

It should be noted that all numeric values disclosed herein (including all disclosed thickness values, limits, and ranges) may have a variation of ±10% (unless a different variation is specified) from the disclosed numeric value. For example, a layer disclosed as being "t" units thick can vary in thickness from (t−0.1 t) to (t+0.1 t) units. Further, all relative terms such as "about," "substantially," "approximately," etc. are used to indicate a possible variation of ±10% (unless noted otherwise or another variation is specified). Moreover, in the claims, values, limits, and/or ranges of the thickness and atomic composition of, for example, the described layers/regions, means the value, limit, and/or range ±10%.

It should be noted that the description set forth herein is merely illustrative in nature and is not intended to limit the embodiments of the subject matter, or the application and uses of such embodiments. Any implementation described herein as exemplary is not to be construed as preferred or advantageous over other implementations. Rather, the term "exemplary" is used in the sense of example or "illustrative," rather than "ideal." The terms "comprise," "include," "have," "with," and any variations thereof are used synonymously to denote or describe a non-exclusive inclusion. As such, a device or a method that uses such terms does not include only those elements or steps, but may include other elements and steps not expressly listed or inherent to such device and method. Further, the terms "first," "second," and the like, herein do not denote any order, quantity, or importance, but rather are used to distinguish one element from another. Similarly, terms of relative orientation, such as "top," "bottom," etc. are used with reference to the orientation of the structure illustrated in the figures being described. Moreover, the terms "a" and "an" herein do not denote a limitation of quantity, but rather denote the presence of at least one of the referenced item.

In this disclosure, the term "region" is used generally to refer to one or more layers of material. That is, a region (as used herein) may include a single layer (or film or coating) of material or multiple layers or coatings (or films) of materials stacked one on top of another to form a multi-layer system. Further, although in the description below, the different regions in the disclosed stack/structure are sometimes referred to by specific names (such as, e.g., capping layer, reference layer, transition layer, etc.), this is only for ease of description and not intended as a functional description of the layer.

As alluded to above, in one exemplary aspect, the magnetoresistive device of the present disclosure, formed from a magnetoresistive stack/structure, may be used in a magnetic tunnel junction type device (MTJ device). The MTJ device may be implemented, for example, as a spin-torque magnetoresistive random access memory ("MRAM") element ("memory element"), a magnetoresistive sensor, a magnetoresistive transducer, etc. In such aspects, the magnetoresistive stack/structure may include an intermediate layer positioned (or sandwiched) between two ferromagnetic regions/layers. The intermediate layer may be a tunnel barrier and may include an insulating material, such as, e.g., a dielectric material. In other embodiments, the intermediate layer may be a conductive material, including, but not limited to, a non-magnetic conductive material such as, e.g., copper, gold, or alloys thereof. In such embodiments, where the magnetoresistive stack/structure includes a conductive material in between two ferromagnetic regions/layers, the magnetoresistive stack/structure may form a Giant magnetoresistive (GMR) or GMR-type device.

For the sake of brevity, conventional manufacturing techniques related to semiconductor processing may not be described in detail herein. The exemplary embodiments may be fabricated using known manufacturing techniques and processes, including, but not limited, lithographic processes. The fabrication of integrated circuits, microelectronic devices, micro electro mechanical devices, microfluidic devices, and photonic devices involves the creation of several layers of materials that interact in some fashion. One or more of these layers may be patterned so various regions of the layer have different electrical or other characteristics, which may be interconnected within the layer or to other layers to create electrical components and circuits. These regions may be created by selectively introducing or removing various materials. The patterns that define such regions are often created by lithographic processes. For example, a layer of photoresist is applied onto a layer overlying a wafer substrate. A photo mask (containing clear and opaque areas) is used to selectively expose the photoresist by a form of radiation, such as ultraviolet light, electrons, or x-rays. Either the photoresist exposed to the radiation, or not exposed to the radiation, is removed by the application of a developer. An etch may then be employed/applied, whereby the layer not protected by the remaining resist is patterned. Alternatively, an additive process can be used in which a structure is built up using the photoresist as a template.

As noted above, in one aspect, the described embodiments relate to, among other things, methods of manufacturing a magnetoresistive device, e.g., a magnetic tunnel junction bit (MTJ bit) or a magnetic tunnel junction type device (MTJ device), from a magnetoresistive stack/structure. The magnetoresistive stack/structure may include, or may be operably coupled to, one or more electrically conductive electrodes, vias, or conductors on either side of a magnetic material stack. As described in further detail below, the magnetic material stack may include many different regions or layers of material, where some of the layers include magnetic materials, whereas others do not. In one embodiment, the methods of manufacturing may include sequentially depositing, growing, sputtering, evaporating, and/or providing (collectively referred herein as "depositing" or other verb tense (e.g., "deposit" or "deposited")) layers and regions which, after further processing (for example, etching) those layers form a magnetoresistive stack/structure.

The described magnetoresistive stacks/structures may be formed between a top electrode/via/line and a bottom electrode/via/line, both of which may permit access to the stack/structure by allowing for connectivity (for example, electrical) to circuitry and other elements of the magnetoresistive device. Between the electrodes/vias/lines are layers and/or regions, the described magnetoresistive stack/structure may include at least one "fixed" magnetic region (which may include, among other things, a plurality of ferromagnetic layers), at least one "free" magnetic region (which may include, among other things, a plurality of ferromagnetic layers), and one or more intermediate layers or regions disposed between a "fixed" magnetic region and the "free" magnetic region. In some embodiments, the one or more intermediate layers or regions may be a dielectric layer or region. In other embodiments, however, the one or more intermediate layers or regions may be a conductive layer or region. In some embodiments, the top electrode (and/or the bottom electrode) may be eliminated, and the bit line may be formed on top of the magnetoresistive stack.

FIG. 1 illustrates a cross-sectional view of an exemplary magnetoresistive stack/structure 100 (for example, an in-plane or out-of-plane magnetic anisotropy magnetoresistive stack/structure (e.g., a perpendicular magnetic anisotropy magnetoresistive stack/structure)) having multiple regions (10, 20, 30, etc.) formed one on top of another. For the sake of brevity, in the discussion below, the magnetoresistive stack/structure 100 is referred to as a "magnetoresistive stack." It will be recognized that several other commonly-used regions (or layers) (e.g., various protective cap layers, seed layers, etc.) are not illustrated in FIG. 1 (and in subsequent figures) for clarity. Each of the regions (e.g., regions 10, 20, 30, etc.) of magnetoresistive stack 100 may comprise one or more layers of material. That is, for example, in some embodiments, region 10 may comprise a single layer of a material (e.g., an element, a chemical composition, alloy, composite, etc.) formed on (e.g., directly on) or above region 20, and region 20 may comprise one or more layers of materials (of the same or different materials) sequentially formed (one on top of another) on region 30. In the discussion below, the term "region" is intended to cover both a region or a zone comprising a single layer of material (e.g., region 10 in the example above) and a region or zone comprising multiple layers of material (e.g., region 20 in the example above).

As known to one skilled in the art, the interface between adjacent regions (e.g., regions 10, 20, 30, etc.) (and/or the interface between adjacent layers, if any, within a region) may, in some cases, be characterized by compositional (e.g., chemical) and/or structural changes due to intermixing between the materials (or intermetallic formation) of the adjacent regions (e.g., during deposition, post deposition anneal, etc.). For example, while the compositional profile across an ideal interface (i.e., an interface which does not undergo compositional changes) between two regions (or layers) may indicate a sharp profile (i.e., the composition abruptly changes from the composition of one region to that of the other region), the compositional profile across a typical interface of magnetoresistive stack 100 of FIG. 1 may indicate a different profile. For example, the profile may indicate a gradual change in chemical composition across an interface of two regions if intermixing occurs between the materials of the regions, or the profile across the interface may indicate the presence of a different composition in the vicinity of the interface if a different interfacial phase (e.g., an intermetallic) is formed at the interface.

Magnetoresistive stack 100 of FIG. 1 may include intermediate regions 40 and 60 (such as, for example, a dielectric layer or a conductive layer (e.g., a non-magnetic conductive layer)) disposed between magnetic material regions 30 and 50, and/or magnetic material regions 50 and 70. In a fabricated magnetoresistive device (e.g., MRAM, etc.), the magnetic material regions 30, 70 may function as a "fixed" magnetic region, the magnetic material region 50 may function as a "free" magnetic region, and the intermediate regions 40, 60 may function as tunnel barriers. As illustrated in FIG. 1, for example, regions 30, 40, 50, 60, and 70 may be sequentially formed between electrically conductive regions 20 and 80. In the fabricated magnetoresistive device, regions 20 and 80 may function as electrodes. For example, region 20 may be a top electrode and region 80 may be a bottom electrode. However, those of ordinary skill in the art will recognize that the relative order of the various regions of magnetoresistive stack 100 may be reversed. That is, region 20 may function as the bottom electrode and region 80 may function as the top electrode.

Regions 20 and 80 may include any electrically conductive material, and may be part of (or be in physical contact with) electrically conductive interconnects (e.g., vias, traces, lines, etc.) of the magnetoresistive stack 100 (e.g., as shown in FIG. 8). Although any electrically conductive material may be used for regions 20, 80, in some embodiments, a metal such as tantalum (Ta), titanium (Ti), tungsten (W), or a composite or alloy of these elements (e.g., tantalum-nitride alloy) may be used. In some embodiments, one or both of regions 20 and 80 may be eliminated. For example, in some embodiments, region 20 may be eliminated by positioning the bit line (of the MRAM) on top of the stack 100, and region 80 may be eliminated by forming the stack 100 on a conductive region of the die backend (metallization layer, redistribution layer, etc.).

As illustrated in FIG. 1, region 80 may be formed on a planar (or substantially planar) surface of a semiconductor substrate 90 (e.g., backend of an IC device, etc.), and regions 70, 60, 50, 40, 30, 20, and 10 may each be formed on, or above, the underlying region or regions. Each region may be formed directly on the underlying region, or may be formed on an intermediate layer (seed layer, etc.) formed, or deposited, on a surface of the underlying region. For example, although not illustrated in FIG. 1, in some embodiments, the top surface of region 80 (i.e., the surface of region 80 on which region 70 is formed) may include a seed layer or region. The seed layer may be formed by converting a portion of the top surface of region 80 into the seed layer, or the seed layer may be deposited on the top surface of region 80. This seed layer region may facilitate the formation of region 70 thereon, and in some embodiments, may include one or more of nickel, chromium, cobalt, iron, and/or alloys thereof (for example, an alloy including nickel and/or chromium). In general, any suitable material deposition process (CVD, PVD, sputtering, plating, etc.) may be used to form an overlying region on the corresponding underlying region (e.g., region 70 on region 80, region 60 on region 70, etc.). Since such processes are well known in the art, they are not discussed in greater detail herein.

As explained above, regions 30 and 70 may serve as a "fixed" magnetic region, and region 50 may serve as a "free" magnetic region of magnetoresistive stack 100. That is, a magnetic moment vector in a "fixed" region(s) 30, 70 does not move significantly in response to applied magnetic fields (e.g., an external field) or applied currents used to switch the magnetic moment vector of "free" region 50, as explained above. Regions 30, 50, 70 are illustrated as a single layer in FIG. 1 only for the ease of illustration. As explained previously, in some embodiments, each of these regions (e.g., regions 30, 50, 70) may comprise several layers of a magnetic or a ferromagnetic material formed one on top of another. In addition, regions 30, 50, and 70 may also include additional layers, including, but not limited to, an antiferromagnetic coupling layer, a reference layer, an insertion layer, and/or a transition layer.

In some embodiments, regions 30, 70 may include alloys that include cobalt, nickel, iron, and/or boron. In some embodiments, one or both of these layers may also include, for example, alloys or engineered materials with one or more of palladium, platinum, magnesium, manganese, and chromium. Additionally, or alternatively, in some embodiments, one or both of the regions 30, 70 may comprise synthetic antiferromagnetic (SAF) or synthetic ferromagnetic (SyF) structures. Since SAFs and SyFs are known to those skilled in the art, additional description is omitted for the sake of brevity. In some embodiments, one or both of the regions 30, 70 may include one or more non-magnetic material layers. For example, ruthenium, copper, aluminum, tantalum, titanium, niobium, vanadium, zirconium, iridium, one or more alloys of these elements, and in certain embodiments, tungsten and molybdenum. In some embodiments, one or both of the regions 30, 70 may include a multi-layer structure of cobalt and platinum or cobalt and nickel (with or without other alloying elements). For example, in embodiments where regions 30 and/or 70 include a multi-layer structure of cobalt and platinum, the regions 30 and/or 70 may include a cobalt layer followed by a platinum layer formed on or above a surface of the cobalt layer. In general, regions 30, 70 may have any suitable thickness (e.g., between approximately 8-300 Å).

Region 50 (which, as explained above, may function as the "free" magnetic region of the magnetoresistive stack 100) may be constructed such that a magnetic vector (or moment) in this region may be moved or switched by applied magnetic fields or currents (e.g., a spin-torque current). As with conventional magnetoresistive stacks/structures, the direction of the magnetization (i.e., the magnetic vector/moment) in region 50 determines the resistance of magnetoresistive stack 100. Similar to regions 30 and 70, region 50 may also comprise one or more ferromagnetic layers. Region 50 may include alloys of one or more of ferromagnetic elements, such as, nickel, iron, and cobalt. In some embodiments, one or more such alloys also may also include boron. In some embodiments, additional elements may be added to the alloys to provide improved magnetic, electrical, or microstructural properties.

In some embodiments, region 50 may comprise multiple ferromagnetic layers separated by one or more intermediate layer(s) between the ferromagnetic layers. The ferromagnetic layers may include alloys of cobalt, iron, and boron, and the intermediate layer(s) may include a nonmagnetic material (e.g., tantalum, tungsten, molybdenum, ruthenium, rhodium, rhenium, iridium, chromium, osmium, vanadium, zirconium, titanium, niobium, molybdenum, hafnium, manganese, and their combinations) that provides coupling (e.g., ferromagnetic or antiferromagnetic coupling) between two adjacent ferromagnetic layers. In some embodiments, the thickness and/or the configuration of the intermediate layer(s) may be selected such that it does not form a continuous layer separating (and thus breaking direct electron exchange between) the adjacent ferromagnetic layers. Instead, the intermediate layer(s) may form a non-continuous layer (e.g., areas or patches of material) between the adjacent ferromagnetic layers. In some embodiments, the material of an intermediate layer may mix with the materials of the adjacent ferromagnetic layers to form a continuous region 50 (e.g., having a chemical composition that varies across the thickness of the region) so that adjacent ferromagnetic layers are directly exchange coupled to each other. In general, region 50 may have any thickness (e.g., between approximately 7-40 Å), and the thickness of the intermediate layer (if any) may typically be less than approximately 3.5 Å.

One or more layers of region 50 also may include alloys or engineered materials with one or more of, for example, palladium, platinum, magnesium, manganese, and chromium. In some embodiments, similar to regions 30 and 70, region 50 also may include one or more SAF or SyF structures, and one or more layers of non-magnetic materials, such as, for example, ruthenium, copper, aluminum, tantalum, titanium, vanadium, zirconium, iridium, tungsten, molybdenum, and alloys thereof. In some embodiments, one or more layers of the region 50 also may include ordered L10 alloys (such as, for example, Iron-Platinum (FePt), Iron-Palladium (FePd), Cobalt-Platinum (CoPt), or Iron-Nickel-Platinum (FeNiPt)), artificial multi-layered structures (such as, Cobalt/Platinum (Co/Pt), Cobalt/Palladium (Co/Pd), Cobalt-Chromium/Platinum (CoCr/Pt), Cobalt/Gold (Co/Au), or Nickel/Cobalt (Ni/Co)), and alloys of Cobalt-Iron-Boron (CoFeB). These materials may provide a strong perpendicular magnetic anisotropy (PMA) to region 50 and may improve the performance of magnetoresistive stack 100. As explained previously, any suitable deposition process may be used to form regions 30, 50, and/or 70. In some embodiments, some or all of these regions (or one or more layers that make up these regions) may be deposited using a "heavy" inert gas (for example, xenon, argon, krypton, etc.), for example, at room temperature (for example, about 15-40° C., and more preferably about 20-30° C., and most preferably about 25° C. (+/−10%)) or at a conventional/typical elevated temperature.

With continued reference to FIG. 1, an intermediate region 60 may be positioned between regions 70 and 50, and, in some embodiments, another intermediate region 40 may be positioned between regions 50 and 30. In some embodiments, the intermediate regions 40, 60 may include a dielectric material, and may function as a tunnel barrier in the magnetoresistive stack 100. However, it is also contemplated that, one or both of the intermediate regions 40, 60 may include a conductive material (e.g., copper) to form a GMR-type magnetoresistive stack/structure. In general, intermediate regions 40, 60 may be formed using any technique now known (e.g., deposition, sputtering, evaporation, etc.) or later developed. In some embodiments, one or both of intermediate regions 40, 60 may include an oxide material, such as, for example, Magnesium Oxide (MgO) or Aluminum Oxide (AlO$_x$) (e.g., Al$_2$O$_3$), and may be formed by multiple steps of material deposition and oxidation. In general, the intermediate regions 40, 60 may have any thickness (e.g., between approximately 8.5-14.1 Å).

Although not illustrated in FIG. 1, in some embodiments, region 70 (and/or region 50) may include one or more interfacial regions (e.g., a transition layer, interfacial layer, etc.) disposed at its interface with intermediate region 60 (and/or region 40, respectively). These interfacial regions may include one or more layers of material that, among other things, facilitate/improve growth of the intermediate region 60 (and/or 40) during fabrication. In one embodiment, the interfacial region between regions 70 and 60 (and/or regions 50 and 40) may include one or more layers of an amorphous alloy including one or more of cobalt and/or iron (e.g., cobalt-iron-boron (CoFeB), cobalt-iron-boron-tantalum (CoFeBTa), or cobalt-iron-tantalum (CoFeTa)) and one or more layers of a non-ferromagnetic transition metal (e.g., tantalum, titanium, tungsten, ruthenium, niobium, zirconium, and/or molybdenum). In some embodiments, during processing, a layer of iron (for example, deposited as pure or substantially pure iron) and a layer of cobalt, iron, and boron (for example, deposited as an alloy) may be deposited on the top surface (with reference to FIG. 1) of region 70. After further/final processing (e.g., after annealing), the layer of iron at the interface between regions 70 and 60 may form a continuous atomic layer, or may mix with the underlying ferromagnetic alloy of region 70 in the final annealed structure, resulting in a high-iron concentration in region 70 at its interface with region 60.

With continued reference to FIG. 1, region 20 may be provided (deposited, grown, sputtered, etc.) on or above region 30, and region 10 may be provided on or above region 20. As explained previously, region 20 may be formed of a material, such as, for example, tantalum, titanium, tungsten, or a composite or alloy of these elements (e.g., tantalum-nitride alloy), and in some embodiments, region 20 may be eliminated altogether. Region 10, in some embodiments, may serve as a hard mask to assist in the subsequent processing (etching, patterning, etc.) of the magnetoresistive stack 100. That is, region 10 may protect the underlying regions from reactive compounds and gases used in the subsequent processing (e.g., etching) of magnetoresistive stack 100. Region 10 may be formed or deposited using any now known or later developed technique. In some embodiments, region 10 may include silicon oxide, silicon nitride, and/or another material that is relatively inert to the reactants used during subsequent processing, such as, e.g., etching.

In some embodiments, region 10 may include one or more metals (e.g., region 10 may be a metal hard mask). Suitable metals for region 10 may include, for example, noble metals and/or alloys thereof, for example, alloys of a noble metal with transition metals (for example, Platinum (Pt), Iridium (Ir), Molybdenum (Mo), Tungsten (W), Ruthenium (Ru), and/or an alloy of AB (where A=Pt, Ir, Mo, W, Ru and B=Fe, Ni, Manganese (Mn)). In some embodiments, region 10 may be comprised of materials such as, Titanium-Nitride (TiN), Platinum Manganese (PtMn), or Iridium-Manganese (IrMn). In some embodiments, region 10 may include multiple layers of material formed one atop another. For example, in some embodiments, region 10 may include TiN over PtMn and/or IrMn. In some embodiments, region 10 may be formed by a material harder than an ultralow K dielectric material used in the magnetoresistive stack 100. In general, region 10 may have any thickness. In some embodiments, the thickness of region 10 may be in the range of approximately 5-200 Å. In some embodiments, region 10 may be, for example, approximately 15-150 Å thick, or preferably approximately 20-100 Å thick.

When implemented in an MTJ-like memory device, magnetoresistive stack 100 of FIG. 1 may be referred to as having a dual spin filter (DSF) structure with a first MTJ comprising regions 70, 60, and 50, and a second MTJ comprising regions 30, 40, and 50. In some embodiments of the present disclosure, a magnetoresistive stack may only include a single MTJ. FIG. 2 illustrates an exemplary magnetoresistive stack 200 having a single MTJ comprising regions 70, 60, and 50. The regions of magnetoresistive stack 200 which are similar to the regions of the MTJ formed by magnetoresistive stack/structure 100 (of FIG. 1) are numbered similarly, and not described again for the sake of brevity. As illustrated in FIG. 2, in some embodiments, an interfacial region 45 may be provided at the interface between regions 50 (which, as explained above with reference to FIG. 1, may serve as the "free" region) and region 20 (which may be an electrode of MTJ 200). Region 45 may serve as a capping region, and may comprise one or more layers of a dielectric material (e.g., MgO, $Al_2O_3$, etc.). In some embodiments, the interfacial region 45 may have a thickness between approximately 3-14 Å. Although not illustrated in FIG. 2, some embodiments of the described magnetoresistive stacks may additionally include a discontinuous layer of an insertion material at the interface between region 50 and the interfacial region 45. This insertion material may be a dusting (e.g., non-continuous patches or areas) of any non-ferromagnetic transition metal element (e.g., Ir, Cr, etc.) having a thickness of less than one atomic layer of the material selected. The insertion material may increase the PMA of the resulting magnetoresistive stack 200. Although the interfacial region 45 of FIG. 2 and the insertion material are not illustrated in FIG. 1, in some embodiments, magnetoresistive stack 100 of FIG. 1 may also include a similar interfacial region and an insertion material.

The exemplary stacks/structures 100, 200 of FIGS. 1 and 2, and the method of fabricating these stacks/structure are described herein as illustrative examples. Many other stacks or structures are possible. Some other exemplary magnetoresistive stacks and fabrication methods are described in U.S. Pat. Nos. 8,686,484; 8,747,680; 9,023,216; 9,136,464; and 9,419,208, each assigned to the assignee of the current application and incorporated by reference in its entirety herein. Each of these stacks/structures may be used in connection with the current disclosure. Further, as explained previously, although a magnetoresistive stack/structure is used to describe aspects of the current disclosure, the disclosure is not limited thereto. Instead, the current disclosure may be applied in the fabrication of any integrated circuit device structure.

After the multi-layer magnetoresistive stack 100 of FIG. 1 (or magnetoresistive stack 200 of FIG. 2) is formed, the multi-layer structure may be etched to form one or more magnetoresistive devices in a desired pattern. The magnetoresistive devices may include, but are not limited to, magnetic tunnel junction bits, such as, e.g., MTJ bits 120 shown in FIG. 3. These MTJ bits 120 may be further processed to form the desired magnetoresistive device, such as, e.g., an MTJ device that functions as a sensor or a memory device. FIG. 3 illustrates the magnetoresistive stack 100 of FIG. 1 etched in an exemplary pattern to form multiple MTJ bits 120 at a desired pitch by etching spaces (referred to hereinafter as channels 110) between the bits 120. Though the MTJ bits 120 and/or channels 110 depicted in FIG. 3 appear to have substantially uniform vertical side walls, those of ordinary skill in the art will readily recognize that the side walls may include one or more irregularities. Any now known etching process (e.g., sputter etching, ion beam etching (IBE) or milling, reactive ion beam etching (RIE) or milling, etc.) or later developed etching process may be used to etch through the different regions of the magnetoresistive stack 100 (of FIG. 1) to form the MTJ bits 120 of FIG. 3. In some embodiments, after deposition of region 10 (e.g., the hard mask layer), a photo resist may be deposited thereon, and patterned to predetermined dimensions consistent with, or correlated to, the desired dimensions of the MTJ bits 120 (of FIG. 3). The photo resist may be deposited and patterned using any now known or later developed technique (e.g., well known conventional deposition and lithographic techniques). Region 10 (e.g., the hard mask layer) may then be etched using a suitable etching technique to transfer the photo resist pattern to region 10 (e.g., remove region 10 from areas above the channels 110). Although not required, in some embodiments, the photo resist may be removed or stripped from the magnetoresistive stack 100 (e.g., from above region 10 using conventional techniques) after region 10 is patterned and/or before subsequent processing of magnetoresistive stack 100.

The multiple regions of the magnetoresistive stack 100 may then be etched with region 10 "protecting" or masking the areas covered by the remaining portions of region 10, to form, define, pattern and/or provide the MTJ bits 120 separated by channels 110 (see FIG. 3). In some embodiments, region 10 may not be patterned prior to etching the regions underlying region 10. Instead, a mask (e.g., a photoresist mask) may be used to selectively etch through the multiple regions of the stack including region 10. The multiple regions (e.g., regions 20, 30, 40, 50, 60, 70, 80) of the magnetoresistive stack 100 may be etched by any suitable process now known, such as, for example, IBE, RIE, etc., or developed in the future. As known to people skilled in the art, IBE and RIE use beams of charged ions (comprising one or more of Argon, Krypton, Xenon, etc.) (reactive charged ions in the case or RIE) to etch through multiple regions of the magnetoresistive stack 100 and form the channels 110. During the etching, the magnetoresistive stack 100, with selected areas covered by patterned region 10, may be placed in a vacuum chamber, and exposed to the ion beam. The impact of the ions ablates the areas of the stack not covered by region 10.

During etching of the magnetoresistive stack 100 to form the channels 110, the parameters of the etching process (e.g., pressure, bias power, etching gas, etc.) may be controlled to create an anisotropic or a directional etch to preferentially remove material in the downward direction (in FIG. 3). As is known to those of ordinary skill in the art, during an anisotropic or a directional etch, material is preferentially removed in one direction (e.g., increased rate of etching in the vertical direction in FIG. 3 as compared to horizontal directions), and during an isotropic or a non-directional etch, material is removed from all directions. As known to those of ordinary skill in the art, the parameters that control a particular etching process (e.g., RIE, IBE, etc.) may be controlled to make the resulting etching more anisotropic or more isotropic. For example, increasing the bias power, decreasing the pressure, and/or increasing the concentration of heavier gases (e.g., Argon, Xenon, etc.) in the plasma may increase the mean free path and the momentum of the ions during etching, and cause them to accelerate in a single direction (e.g., create a collimated ion beam), resulting in a more anisotropic etch. In contrast, decreasing the bias power, increasing the pressure, and/or decreasing the concentration of the heavier gases (e.g., by increasing the concentration of neutral gases (e.g., nitrogen) or reactive gases (e.g., fluorine, methanol, carbon monoxide, etc.) in the plasma may decrease the mean free path of the ions, increase ion-ion collisions, and result in a more isotropic etch. It should be noted that the adjustments described above are merely exemplary and many other adjustments are possible. Since methods (such as, e.g., adjustment of variables) to convert an anisotropic etch to an isotropic etch (and vice versa) are well known in the art, they are not described in more detail herein. It should be also noted that, although material is preferentially removed in one direction during an anisotropic etch, there will be some amount of etching in other directions. Similarly, although material is removed in all directions during an isotropic etch, the rate of etching in some directions may be higher.

Using an anisotropic etch to form the channels 110 (in FIG. 3) decreases etching of the MTJ bits 120 in a sideways direction and result in the side walls of the channels 110 being relatively more vertical. However, during the etching process, a portion of the ablated material may be redeposited on the side walls of the MTJ bits 120 (e.g., as a veil) to form a redeposited-layer 130. Although FIG. 3 and the description herein refers to the redeposited material forming a layer, e.g., layer 130, 130', and 130", on the side walls of the described MTJ bits, those of ordinary skill in the art will recognize that the redeposited material may not be uniform or form a complete "layer" on the sidewalls. Instead, the material may be redeposited in irregular patterns or quantities. The redeposited-layer 130 may include nonvolatile byproducts of the multiple regions (e.g., regions 20, 30, 40, 50, 60, 70, 80) that are removed (or ablated) by the etching process. The redeposited-layer 130 may include both magnetic and non-magnetic materials from the different regions. Due to the ferromagnetic and other electrically conductive materials in some of the removed regions (e.g., regions 20, 30, 50, 70, 80, etc.), the redeposited-layer 130 may be electrically conductive and/or magnetically active. The redeposited layer 130 may, in some cases, also detrimentally affect the resistance and magnetic property distribution within an array of MTJ bits 120. To prevent electrical shorting between the multiple regions along the thickness of MTJ bit 120 (e.g., regions 80 and 20, 30 and 70, etc.), and to preserve the magnetic property distribution in the MTJ bit array, the side walls of the bits may be cleaned to remove at least a portion of the redeposited-layer 130 after etching the channels 110 or portions thereof.

In some embodiments, an angled etching process, (e.g., an etching process utilizing an ion beam angled relative to the wafer or the wafer may be tilted with respect to the ion beam) may be used to etch away (or remove) some or all of the redeposited-layer 130 from the side walls of the MTJ bits 120. However, with increasing height and/or decreasing pitch of the MTJ bits 120, it may be hard to remove portions of the redeposited-layer 130 towards the bottom of the channel 110 using such angled etching processes (or other similar processes). In some cases, the resulting remaining redeposited-layer 130 on the side walls may have the potential to cause electrical shorts (and/or other variations in the magnetic property distribution) of MTJ bits 120. Therefore, in some embodiments, the process of forming the MTJ bits 120 may be modified according to the principles described herein.

In some embodiments, after forming the channels 110, the side walls of the MTJ bits 120 may be cleaned to remove at least a portion of the redeposited-layer 130 using an isotropic etching process. That is, with reference to FIG. 3, after etching the channels 110 using, e.g., an anisotropic, or substantially anisotropic, etching process to form the MTJ bits 120 with a redeposited-layer 130 on its side walls, an isotropic, or relatively more isotropic (as compared to the etching process that formed MTJ bits 120), etching process may be used to remove at least a portion of the redeposited-layer 130. In general, any now known or future developed isotropic, or substantially isotropic, etching process may be used to clean the side walls of MTJ bits 120. In some embodiments, the process variables of the same (or similar) anisotropic etching process used to form the channels 110 (e.g., RIE, IBE, etc.) may be adjusted to create a relatively more isotropic etch for cleaning re-deposited material (e.g., redeposited-layer 130) from the side walls of MTJ bits 120. For example, as explained previously, etching processes such as RIE and IBE may be controlled to be anisotropic or isotropic by adjusting variables such as, e.g., bias power, chamber pressure, and the constituents in the plasma. Since techniques to produce an anisotropic or an isotropic etch from other etching processes are known in the art, they are not described herein. The isotropic etching process may be continued until substantially all, or any desired amount, of the redeposited-layer 130 on the side walls of the MTJ bits 120 is removed. In some embodiments, the isotropic etching process may be characterized to determine the etching time needed to remove the desired amount of the redeposited-layer 130, and the etching process may be continued for this predetermined amount of time.

After removing the redeposited-layer 130 from the side walls of the MTJ bits 120, an encapsulant 135 may be deposited on the MTJ bits 120 and within channels 110 to form a conformal coating over the exposed regions of the bits 120 (including the side walls). The encapsulant 135 may serve as an inter-layer dielectric (ILD), and may, in general, include any electrically nonconductive material. In some embodiments, silicon nitride (e.g., $Si_3N_4$, SiN, etc.) or silicon oxide (e.g., $SiO_2$, $SiO_x$, etc.) may be used as the encapsulant 135. However, other materials such as, for example, a low-k ILD material (e.g., carbon doped $SiO_2$ (SiOC), Carbon Doped Oxide (CDO), Organo Silicate Glass (OSG) spin-on organics, etc.), aluminum oxide (such as $Al_2O_3$), magnesium oxide (such as MgO), tetraethoxysilane (TEOS), and/or one or more combinations thereof, may also be used as the encapsulant 135. Any suitable process (e.g., chemical vapor deposition (CVD), atomic layer deposition (ALD), etc.) may be used to deposit the encapsulant 135. In some embodiments, the encapsulant 135 may be deposited to completely or substantially completely fill channels 110 in between the multiple MTJ bits 120 as well as cover the MTJ bits 120. In some embodiments, a layer of first encapsulant (e.g., first encapsulant 140 described with reference to FIG. 5C) may first be deposited on the MTJ bits 120 to form a conformal coating on the exposed regions of the bits 120 (e.g., sidewalls) and encapsulant 135 may then be deposited on the MTJ bits 120 coated with the first encapsulant.

After the MTJ bits 120 are formed as described above, additional processing steps (such as, for example, polishing a top surface of the structure to expose a conductive region of the MTJ bits 120, forming a bit contact structure on the exposed regions of the MTJ bits 120 to make electrical contact with these MTJ bits 120, etc.) may be performed to fabricate an MTJ device from the MTJ bits 120. Since these additional processing steps are known to those of ordinary skill in the art, they are not described herein for the sake of brevity.

It should be noted that, although the method of forming MTJ bits 120 are described with reference to magnetoresistive stack 100 of FIG. 1, a similar process may also be used to form magnetoresistive bits from other exemplary magnetoresistive stacks (such as, for example, magnetoresistive stack 200 of FIG. 2 or the magnetoresistive stacks disclosed in U.S. Pat. Nos. 8,686,484; 8,747,680; 9,023,216; 9,136,464; and 9,419,208, the disclosures of which are incorporated by reference herein). For example, with reference to magnetoresistive stack 200 FIG. 2, as described with reference to MTJ stack 100 of FIG. 1, a photo resist may be deposited, patterned, and the pattern transferred to the hard mask region 10. The underlying regions (i.e., regions 20, 45, 50, 60, 70, and 80) of the magnetoresistive stack 200 may then be etched using an anisotropic etching process to form MTJ bits 120. The redeposited-layers 130 formed on the side walls of these MTJ bits 120 are then removed using an isotropic etching process (or at least an etching process that is relatively more isotropic than the etching process used to form MTJ bits 120). Subsequently, an encapsulant (e.g., an ILD) is deposited on the cleaned MTJ bits 120.

Figure 5A:
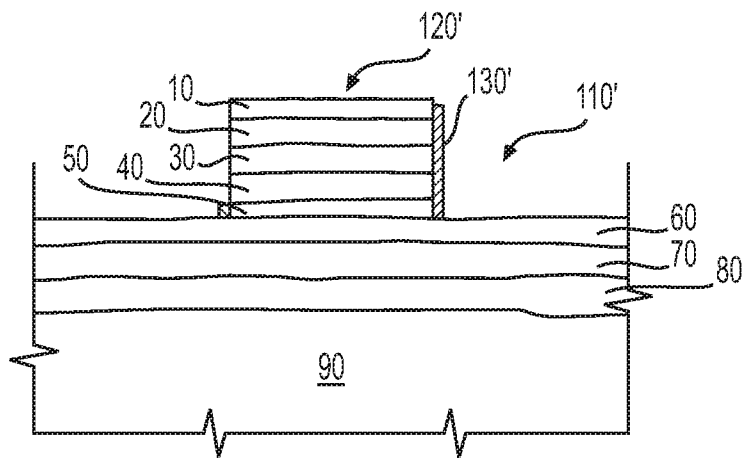

In some embodiments, after forming the magnetoresistive stack 100 of FIG. 1 (or the magnetoresistive stack 200 of FIG. 2), a plurality of the regions, but less than all of the regions, of the magnetoresistive stack 100 may be etched to form partial MTJ bits 120' surrounded by partial channels 110'. FIG. 5A illustrates an exemplary partial MTJ bit 120' formed by terminating the etching process at an interface of region 60 (which, as previously explained, may be a dielectric material that functions as a tunnel barrier in a completed MTJ device) or within region 60. The partial MTJ bit 120' may be formed by any anisotropic etching process, such as IBE, RIE, etc. Any known process may be used to terminate the etching process at region 60. In some embodiments, the etching process may be time and/or endpoint controlled/monitored so as to terminate the etching at or within region 60. For example, in one embodiment, the etching process may be stopped when endpoint monitoring detects the presence or absence of a predetermined material (or a combination of materials) at the bottom of the etched channel or space. That is, the etching process used to etch the partial channel 110' of FIG. 5A may be terminated upon detecting the material (e.g., a dielectric material) of region 60, so as to stop the etch at the beginning of, or within, region 60.

The presence of material of region 60 may be detected during the etching process by any suitable mechanism. In some embodiments, the material of region 60 may be detected based on optical emission spectrometry (OES). That is, the etching process may be terminated when a rise in OES signal for the material of region 60 is detected. Here, the etching process terminates at the beginning of region 60 before significant etching of region 60 occurs. In some embodiments, however, the etching process may be terminated when a significant drop in OES signal of the material of region 50 (i.e., the region above region 60) is detected. Here, the etching process terminates immediately above region 60 after substantially all of region 50 is etched. In some embodiments, the etching process may be continued for a limited duration after etching of region 60 begins so as to terminate the etching process within region 60. Those of ordinary skill in the art will readily recognize that the process of forming channels 110' may be terminated at or within any region 10, 20, 30, 40, 50, 60, 70, or 80 of magnetoresistive stack 100. For example, the process of forming channels 110' may be terminated at or within intermediate layer 40.

As described with reference to FIG. 3, as a result of the etching process, a portion of the etched material may be redeposited on the side walls of the partial MTJ bits 120' to form a redeposited-layer 130' (see, e.g., FIG. 5A). The height of the redeposited-layer may be substantially uniform around the bits (similar to redeposited-layer 130 of FIG. 3) or may be different (as illustrated in FIG. 5A) around a bit or between different bits. The variability in the height of the redeposited-layer 130' may result from a variability in the spacing between the bits or variability in the underlying structure.

Figure 5B:
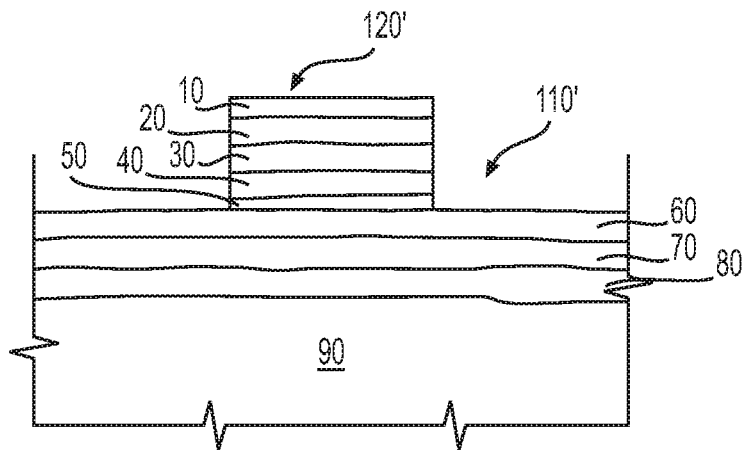

After forming the partial MTJ bits 120', as illustrated in FIG. 5B, the redeposited-layer 130' may be removed (or at least partially removed) using an isotropic etching process. In some embodiments, as described with reference to FIG. 3, the variables of the anisotropic etching process used to etch the partial channel 110' (and form the partial MTJ bit 120') may be adjusted to result in a relatively more isotropic etching process for removing the redeposited-layer 130'. Due to the reduced depth of the partial channel 110' (as compared to channel 110 of FIG. 3), the height of redeposited-layer 130' on the side wall of the partial MTJ bit 120' may be smaller (than on the side wall of the MTJ bit 120 of FIG. 3). Therefore, the redeposited-layer 130' may be removed by an isotropic etching process having a relatively smaller time duration. In some embodiments, as illustrated in FIG. 5B, substantially all of the redeposited-layer 130' may be removed from the side wall of the partial MTJ bit 120'. However, in some embodiments, some (e.g., a relatively smaller amount) of the redeposited-layer 130' may remain on the side wall of MTJ bit 120' after the isotropic etching step. As will be described later, in some embodiments, the step of isotropic etching may be eliminated altogether, and the redeposited-layer 130' may remain on the side walls of the partial MTJ bit 120'.

Figure 5C:
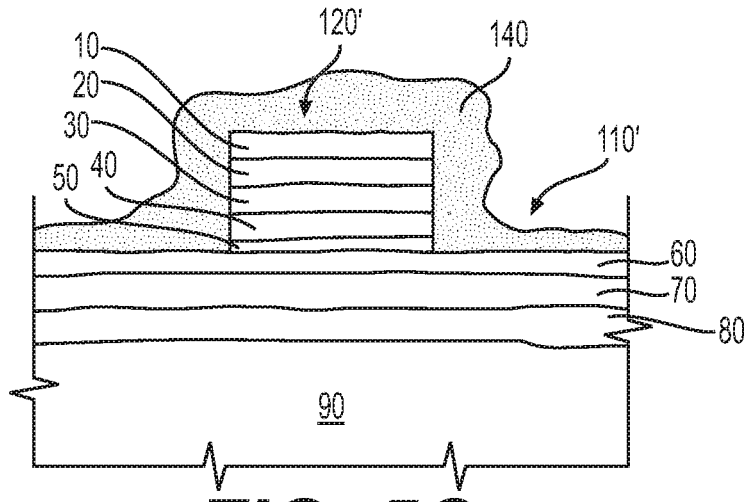

With reference now to FIG. 5C, a first encapsulant 140 may be deposited on the partially formed MTJ bit 120', including its side walls, and within channels 110'. First encapsulant 140 may partially, substantially, or completely fill channels 110'. In some embodiments, a layer of first encapsulant 140 may be deposited on all, or substantially all, of the exposed portions of the partially formed stack/structure of partially formed MTJ bit 120'. Any suitable process (e.g., CVD, ALD, etc.) may be used to deposit the first encapsulant 140. The first encapsulant 140 may, in general, include any electrically non-conductive material (e.g., the same material as encapsulant 135). In some embodiments, silicon nitride (e.g., $Si_3N_4$, SiN, etc.) or silicon oxide (e.g., $SiO_2$, $SiO_x$, etc.) may be used as the first encapsulant 140. However, other materials such as, for example, aluminum oxide (such as, e.g., $Al_2O_3$), magnesium oxide (such as, e.g., MgO), a Tetraethyl orthosilicate (TEOS), and/or one or more combinations thereof, may also be used as the first encapsulant 140. In some embodiments, the first encapsulant 140 may be initially deposited as a conductor (for example, a metal such as aluminum or magnesium), and thereafter oxidized or nitridized to change or transform at least a portion of the deposited material to an insulative material. In general, the first encapsulant 140 may have any thickness. In some embodiments, the thickness of the first encapsulant may be between about 10-500 Å, preferably between about 50-300 Å, and more preferably between about 100-300 Å.

Figure 5D:
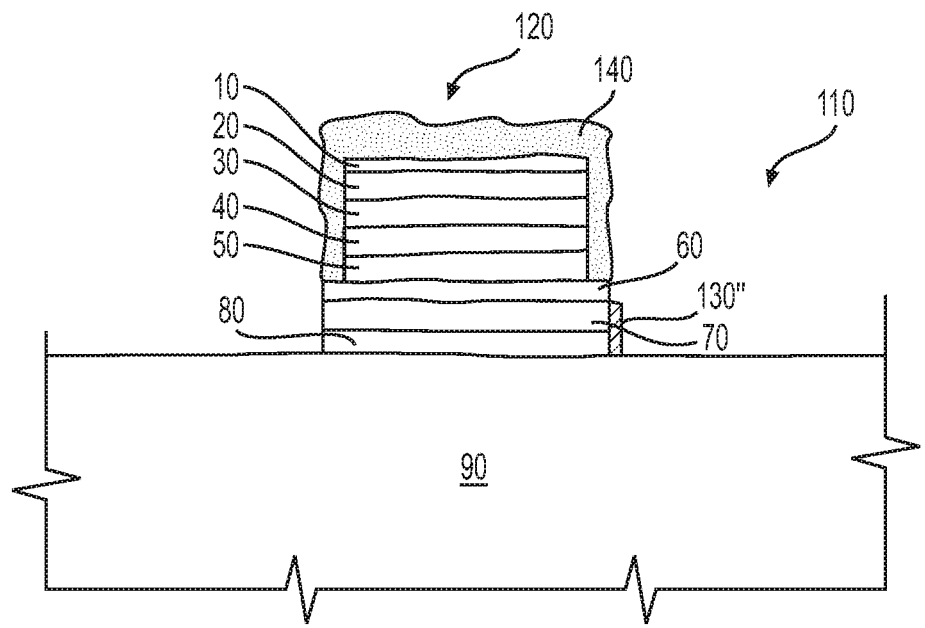

The first encapsulant 140 coating on the partial MTJ bit 120' may then be used as a spacer or a mask to etch the remainder of the stack at the base of the partial channel 110'. In some embodiments, the remainder of the stack may be etched without additional photoresist patterning (e.g., by only using the deposited first encapsulant 140 as a mask or guide). FIG. 5D is a cross-sectional schematic illustration of magnetoresistive stack 100 after the remainder of the regions (e.g., regions 60, 70, and 80) of the stack at the base of the partial channel 110' (see FIG. 5C) have been etched to form multiple complete MTJ bits 120 (only one shown in FIG. 5D) separated by channels 110. Any suitable anisotropic etching process (e.g., IBE, RIE, etc.) may be used for subsequently etching the remaining regions, e.g., regions 60, 70, and 80. During this etching step or process, the first encapsulant 140, deposited on the base of the partial channel 110' (see FIG. 5C) may be first ablated and removed before the underlying regions (e.g., regions 60, 70, and 80) at the base of the partial channel 110' are removed. At the end of the etching step, some (in some cases, substantially all) of the first encapsulant 140 covering the side walls and the top of the partial MTJ bit 120' may also be removed. However, the first encapsulant 140 covering the partial MTJ bit 120' during the etching may prevent significant ablation of the underlying regions of the partial MTJ bit 120'. In some embodiments, the first encapsulant 140 at the base of the partial channel 110' may be removed in an optional etching or cleaning step (using any suitable process) prior to etching the regions (e.g., regions 60, 70, and 80) of the stack 100 at the base of the partial channel 110' (i.e., prior to the etching step of FIG. 5D).

Figure 5E:
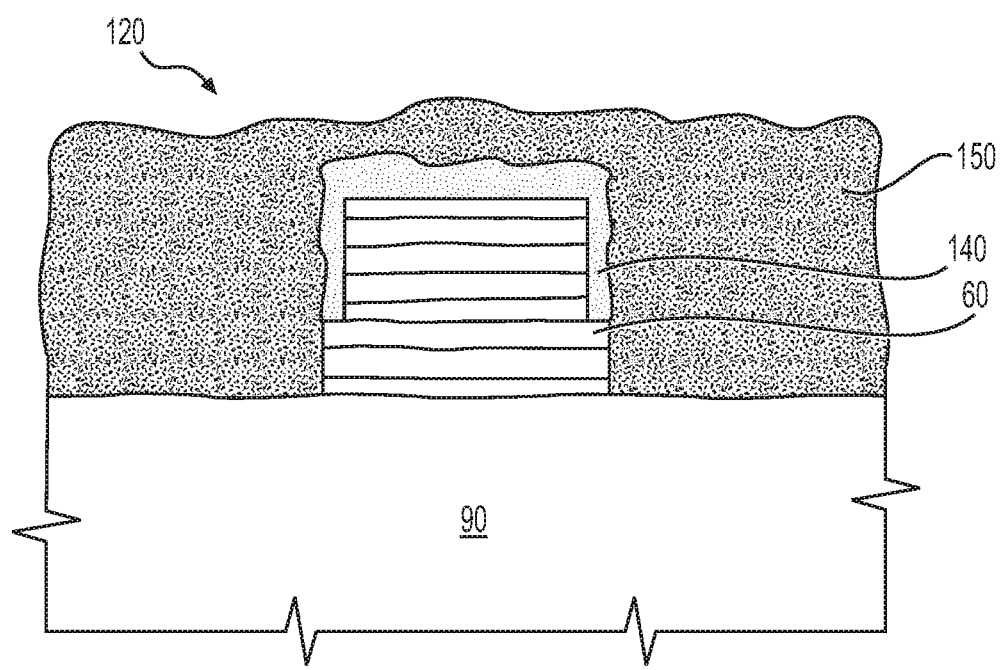

As a result of the etching, a portion of the ablated material from the regions of the stack 100 at the base of the partial channel 110' may get redeposited on the side walls of the MTJ bits 120 to form a redeposited-layer 130'' (see FIG. 5D). In some embodiments, this redeposited-layer 130'' may be removed using an second isotropic etching process (similar to the previously described isotropic etching processes). As explained above, the etching process for removing the redeposited-layer 130'' may be relatively more isotropic than the etching processes used to etch through, e.g., regions 60, 70, and 80. Once the redeposited layer 130'' is removed, a second encapsulant 150 may be deposited on the MTJ bit 120 to form a conformal coating over the exposed regions of the bit 120 (including the side walls) and the first encapsulant 140, as shown in FIG. 5E. The second encapsulate also may partially or completely fill channels 110'. The second encapsulant 150 may include any electrically insulating material. In some embodiments, the second encapsulant 150 may include any material previously described with respect to encapsulants 135 and 140. In some embodiments, both the first encapsulant 140 and the second encapsulant 150 may include the same material. The second encapsulant 150 may be deposited to substantially or completely fill the channels 110' in between the multiple MTJ bits 120' (as depicted in FIG. 5D) or to only partially fill the channels 110'. After the MTJ bits 120 are formed as described above, additional processing steps may be performed to fabricate an MTJ device from the MTJ bits 120, as described previously with reference to FIG. 4.

In the description above the redeposited-layers 130' (see FIG. 5A) and 130'' (see FIG. 5D) formed during the partial etching steps are removed (e.g., etched away) using isotropic etching prior to encapsulation. However, removal of the redeposited-layers 130' and 130'' is not a requirement. That is, in some embodiments, one or both re-deposited layers 130' or 130'' may not be removed. For example, in some embodiments, the redeposited-layer 130' on the side wall of the partial MTJ bit 120' (see FIG. 5A) may not be removed prior to depositing the first encapsulant 140 over the partial MTJ bits 120' (see FIG. 5C). That is, this redeposited-layer 130' may remain on one or both of the side walls of the partial MTJ bit 120'. Because of the lower number of regions (e.g., regions 20, 30, 40, and 50) etched to form the partial MTJ bit 120' (as compared to the MTJ bit 120 of FIG. 3), the redeposited-layer 130' may not be tall or large enough to cause electrical shorting issues, or to change the magnetic behavior, in the finally formed MTJ bit 120'. In such embodiments, after depositing the first encapsulant 140 over the partial MTJ bits 120' (with the redeposited-layer 130' on its side walls), the first encapsulant 140 may be used as a spacer to etch the remainder of the stack 100 at the base of the partial channel 110' using an anisotropic etching process, thereby forming MTJ bits 120 (as described with reference to FIG. 5D). The redeposited layer 130'' formed on the side walls of the MTJ bits 120 (see FIG. 5D) may then be removed using an isotropic etch prior to encapsulating the MTJ bits 120 (and the first encapsulant 140) with the second encapsulant 150 (as described with reference to FIG. 5E). FIG. 6 illustrates an embodiment of the MTJ bit 120 after encapsulation, with the redeposited layer 130' retained on the sidewalls of the partial MTJ bit 120'.

In some embodiments, redeposited-layer 130' may be removed but redeposited-layer 130'' may remain on one or more sidewalls of MTJ bits 120. That is, the redeposited-layer 130' formed on the side wall of the partial MTJ bit 120' after the etching of regions 20, 30, 40 and 50 (see FIG. 5A) may be removed or cleaned using an isotropic etching step prior to depositing the first encapsulant 140. After depositing the first encapsulant 140 over the cleaned partial MTJ bit 120', the remainder of the stack (e.g., regions 60, 70, and 80) may be etched as previously described with reference to FIG. 5D. The redeposited layer 130'' formed on the side wall of the MTJ bit 120 may not be removed prior to encapsulating the MTJ bit 120 with the second encapsulant 150. FIG. 7 illustrates an embodiment of the encapsulated MTJ bit 120 with the redeposited layer 130" retained on the sidewalls of the MTJ bit 120.

Although the above-described method of forming MTJ bits 120 (by first forming partial MTJ bits 120') is described with reference to magnetoresistive stack 100 of FIG. 1, a similar process may also be used to form magnetoresistive bits from other exemplary magnetoresistive stacks (such as, for example, magnetoresistive stack 200 of FIG. 2, or the magnetoresistive stacks disclosed in U.S. Pat. Nos. 8,686,484; 8,747,680; 9,023,216; 9,136,464; and 9,419,208, the disclosures of which are incorporated by reference herein). For example, with reference to FIG. 2, after forming the magnetoresistive stack 200, multiple regions (e.g., regions 10, 20, 45, and 50) of magnetoresistive stack 200 may be etched (e.g., using an anisotropic etching step) to form a plurality of partial MTJ bits separated by a partial channel. The redeposited-layer formed on the side walls of the partial MTJ bits as a result of the etching may then be removed using, e.g., an isotropic etching process, and the partial MTJ bits may encapsulated (e.g., using the first encapsulant 140). The remainder of the stack (e.g., regions 60, 70, and 80) at the base of the partial channel is then etched (e.g., using anisotropic etching) to form MTJ bits, and the redeposited-layer formed on the side walls of the MTJ bits may be removed using, e.g., a subsequent isotropic etch process. The MTJ bits 120 may then be encapsulated (e.g., using the second encapsulant 150) and additional processing performed to fabricate an MTJ device from the MTJ bits. As described previously, in some embodiments, only one of the redeposited-layers (i.e., after formation of the partial MTJ bits or the complete MTJ bit) may be removed prior to encapsulation.

In the description above, the etching step (e.g., partial etching step) used to create the partial MTJ bits 120' are described as being terminated at the beginning of a region (i.e., at the beginning of region 60 in the embodiment of FIG. 5A). However, this is not a requirement. In general, this partial etching step may be terminated anywhere in the region 60. For example, the partial etching step used to create the partial MTJ bits 120' of FIG. 5A may be stopped within region 60 (e.g., approximately 10%, 20%, 30%, 50%, 60%, 70%, 80%, 90%, etc. into the thickness of region 60). In some embodiments, the partial etching step may be terminated in another region (e.g., region 50, 60, 70, etc.). However, when etching a multi-layer magnetoresistive stack comprising a plurality of electrically conductive and electrically insulating layers, terminating the partial etching step at an electrically insulating layer may be advantageous. More specifically, terminating a partial etch step at or within an insulating layer (e.g., region 60) may reduce the likelihood of electrical shorting caused by material redeposited on the sidewalls of magnetoresistive stack.

As alluded to above, the MTJ devices (formed using MTJ bits 120) may include a sensor architecture or a memory architecture (among other architectures). For example, in an MTJ device having a memory configuration, the MTJ bits 120 may be electrically connected to an access transistor and configured to couple or connect to various conductors, which may carry one or more control signals, as shown in FIG. 8. The MTJ devices may be used in any suitable application, including, e.g., in a memory configuration. In such instances, the MTJ devices may be formed as integrated circuits comprising a discrete memory device (e.g., as shown in FIG. 9A) or an embedded memory device having a logic therein (e.g., as shown in FIG. 9B), each including MRAM, which, in one embodiment is representative of one or more arrays of MRAM having a plurality of magnetoresistive stacks/structures, according to certain aspects of certain embodiments disclosed herein.

An exemplary method of fabricating a selected embodiment of a magnetoresistive device (e.g., an MTJ bit) will now be described. It should be appreciated that the described method is merely exemplary. In some embodiments, the method may include a number of additional or alternative steps, and in some embodiments, one or more of the described steps may be omitted. Any described step may be omitted or modified, or other steps added, as long as the intended functionality of the magnetoresistive device remains substantially unaltered. Although a certain order is described or implied in the described method, in general, the steps of the described method need not be performed in the illustrated and described order. Further, the described method may be incorporated into a process of fabricating an MTJ bit for the described magnetoresistive device. Since the additional steps needed to form MTJ bits are known to those of ordinary skill in the art, they are not described herein. Additionally, the described method may be incorporated into a more comprehensive procedure or process having additional functionality not described herein.

FIG. 10 depicts a flow chart of an exemplary method 300 of fabricating a magnetoresistive device (e.g., an MTJ bit) from a magnetoresistive stack (e.g., magnetoresistive stack 100 of FIG. 1). For the sake of brevity, the exemplary method will describe fabricating MTJ bit 120 (of FIGS. 5A-5E) from magnetoresistive stack 100 (of FIG. 1), referencing previously described aspects (materials, fabrication processes, dimensions, etc.) of these embodiments. A magnetoresistive stack may first be provided (step 310). Providing the magnetoresistive stack may include sequentially depositing (and/or growing, sputtering, etc.) the multiple regions of magnetoresistive stack 100, and processing (e.g., annealing, etc.) the deposited regions to form magnetoresistive stack 100. In some embodiments, this step may include using a magnetoresistive stack 100 that was previously formed. The method also includes partially etching through the thickness of the magnetoresistive stack 100 to form a partial magnetoresistive device, e.g., an MTJ bit 120' (step 320). In some embodiments, this step may include using known lithographic techniques (photoresist, photolithography, etc.) to expose selected regions of the magnetoresistive stack 100, and etching through multiple regions of the stack (e.g., less than all the regions) to form a plurality of partial magnetoresistive devices, e.g., MTJ bits 120', separated by partial channels 110' (see FIG. 5A). Etching may be performed using any suitable technique (for example, an anisotropic etching process, etc.). In some embodiments, the partial etch of step 320 may be terminated at the beginning of an insulating layer or region (e.g., region 60), for example, by monitoring OES signals during the etching. However, as described previously, in other embodiments, the partial etch of step 320 may be terminated at other locations (e.g., other regions of the stack or other locations of regions 60 (such as, within region 60, at the end of region 60, immediately after region 60, etc.)).

The redeposited-layer 130' formed on the side walls of the partial MTJ bits 120' (after the partial etch step of 320) may then be removed (at least partially removed) using an isotropic etch (step 330) (see FIG. 5B). Any known isotropic etching process (or an etching process that is more isotropic than step 320) may be used to remove the redeposited-layer 130'. In some embodiments, an anisotropic etching process may be used for the partial etch step of step 320, and the variables associated with this etching process may be adjusted to make the etching process relatively more isotropic in nature for step 330. In some embodiments, step 330 may be omitted and the redeposited-layer 130' may remain on the side walls of the partial MTJ bits 120'. A first encapsulant 140 may be deposited on the partial MTJ bits 120' to cover the MTJ bits 120', including their side walls (step 340) (see FIG. 5C). Any suitable process (CVD, ALD, etc.) may be used to deposit the first encapsulant 140. The first encapsulant 140 may then be used as a spacer to continue etching the remaining regions of the magnetoresistive stack 100 at the base of the partial channel 110' to convert the partial MTJ bits 120' to complete MTJ bits 120 (step 350) (see FIG. 5D). The etching may be performed using any suitable technique (for example, physical etching such as ion beam etching, reactive ion beam etching, etc.). A second redeposited-layer 130" formed on the side walls of the MTJ bits 120 after step 350 may then be removed using a subsequent isotropic etching step (step 360). Any suitable isotropic etching process (e.g., a similar process as step 330) may be used in step 360. In some embodiments, step 360 may be omitted and the second redeposited-layer 130" may remain on the side walls of the MTJ bits 120. A second encapsulant 150 may then be deposited on the MTJ bits 120' (step 370) (see FIG. 5E). Further processing (e.g., polishing to expose the MTJ bits, forming bit contact structures to make electrical contact with the bits, etc.) may then be carried out to fabricate an MTJ device using the MTJ bits 120.

It should be noted that any isotropic etching process, or a substantially isotropic etching process may be used to remove the redeposited layers. In some embodiments, a high pressure isotropic etch, a low bias power etch, a chemical etch (e.g., using fluorine, methanol, carbon monoxide), an etch using a heavier etching gas (e.g., xenon), etching by increasing the source plasma power (compared to the substantially anisotropic etch), etc. may be used to create a substantially isotropic etch.

In one aspect, a method of fabricating a magnetoresistive device is disclosed. The magnetoresistive stack includes at least an intermediate region formed between a magnetically fixed region and a magnetically free region. The method includes etching a magnetoresistive stack using a first etching process to form one or more sidewalls, and etching the magnetoresistive stack using a second etching process after forming the one or more sidewalls. Wherein, the second etching process may be relatively more isotropic than the first etching process.

Various embodiments of the disclosed method may additionally or alternatively include one or more of the following features: each of the first etching process and the second etching process may be one of reactive ion etching (RIE) or ion beam etching (IBE; the first etching process may include a first set of etching parameters, the second etching process may include a second set of etching parameters different from the first set of etching parameters, and each of the first etching process and the second etching process may be one of reactive ion etching (RIE) or ion beam etching (IBE); the step of etching the magnetoresistive stack using the first etching process may result in etched material being redeposited on the one or more sidewalls of the magnetoresistive stack; the step of etching the magnetoresistive stack using the first etching process may result in etched material being redeposited on the one or more sidewalls of the magnetoresistive stack, and the step of etching the magnetoresistive stack using the second etching process may include removing at least a portion of the redeposited material from the one or more sidewalls; the method may further include depositing a first encapsulant on the magnetoresistive stack after etching the magnetoresistive stack using the second etching process; etching the magnetoresistive stack using the first etching process may include terminating the first etching process prior to etching the magnetically fixed region of the magnetoresistive stack; etching the magnetoresistive stack using the first etching process may include terminating the first etching process prior to etching the magnetically fixed region of the magnetoresistive stack, and the method may further include further etching the magnetoresistive stack using the first etching process after the step of etching the magnetoresistive stack using the second etching process; etching the magnetoresistive stack using the first etching process may include terminating the first etching process prior to etching the magnetically fixed region of the magnetoresistive stack, and the method may further include depositing a first encapsulant on the magnetoresistive stack after etching the magnetoresistive stack using the second etching process, and further etching the magnetoresistive stack using the first etching process after the step of depositing the first encapsulant; and etching the magnetoresistive stack using the first etching process may include terminating the first etching process prior to etching at least one of the magnetically fixed region, the magnetically free region, or the intermediate region of the magnetoresistive stack, and the method may further include depositing a first encapsulant on the magnetoresistive stack before etching the magnetoresistive stack using the second etching process, and further etching the magnetoresistive stack using the first etching process after the step of depositing the first encapsulant and before the step of etching the magnetoresistive stack using the second etching process.

In another aspect, a method of fabricating a magnetoresistive device including a magnetoresistive stack with at least an intermediate region formed between a magnetically fixed region and a magnetically free region is disclosed. The method may include etching a first portion of the magnetoresistive stack using a first etching process to form one or more sidewalls, terminating the first etching process prior to etching at least one of the magnetically fixed region, the magnetically free region, or the intermediate region of the magnetoresistive stack. The method may also include etching a second portion of the magnetoresistive stack using a second etching process after forming the one or more sidewalls. The second etching process may be relatively more isotropic than the first etching process.

Various embodiments of the disclosed method may additionally or alternatively include one or more of the following features: both the first etching process and the second etching process may be one of reactive ion etching (RIE) or ion beam etching (IBE); the first etching process may include a first set of etching parameters, the second etching process may include a second set of etching parameters different from the first set of etching parameters, and each of the first etching process and the second etching process may be one of reactive ion etching (RIE) or ion beam etching (IBE); the step of etching a first portion of the magnetoresistive stack using the first etching process may result in etched material being redeposited on the one or more sidewalls of the magnetoresistive stack; the step of etching a first portion of the magnetoresistive stack using the first etching process may result in etched material being redeposited on the one or more sidewalls of the magnetoresistive stack, and the step of etching a second portion of the magnetoresistive stack using the second etching process may include removing at least a portion of the redeposited material from the one or more sidewalls; the method may further include depositing a first encapsulant on the magnetoresistive stack after etching the second portion of the magnetoresistive stack using the second etching process; the method may further include further etching a third portion of the magnetoresistive stack using the first etching process after the step of etching the second portion of the magnetoresistive stack using the second etching process; the method may further include depositing a first encapsulant on the magnetoresistive stack after etching the second portion of the magnetoresistive stack using the second etching process, and further etching a third portion of the magnetoresistive stack using the first etching process after the step of depositing the first encapsulant; and the method may further include depositing a first encapsulant on the magnetoresistive stack before etching the second portion of the magnetoresistive stack using the second etching process, and further etching a third portion of the magnetoresistive stack using the first etching process after the step of depositing the first encapsulant and before the step of etching the second portion of the magnetoresistive stack using the second etching process.

Although various embodiments of the present disclosure have been illustrated and described in detail, it will be readily apparent to those skilled in the art that various modifications may be made without departing from the present disclosure or from the scope of the appended claims.

What is claimed is:

1. A method of fabricating a magnetoresistive device, comprising:
    etching a magnetoresistive stack using a first etching process to form one or more first sidewalls, wherein the magnetoresistive stack includes at least an intermediate region formed between a magnetically fixed region and a magnetically free region;
    etching the magnetoresistive stack using a second etching process after forming the one or more first sidewalls, wherein the second etching process is relatively more isotropic than the first etching process and removes at least a portion of etched material redeposited on one or more second sidewalls;
    depositing a first encapsulant on the magnetoresistive stack, after forming the one or more first sidewalls and before the step of etching the magnetoresistive stack using the second etching process; and
    etching the magnetoresistive stack using the first etching process to form the one or more second sidewalls, after the step of depositing the first encapsulant and before the step of etching the magnetoresistive stack using the second etching process.

2. The method of claim 1, wherein each of the first etching process and the second etching process is one of reactive ion etching (RIE) or ion beam etching (IBE).

3. The method of claim 1, wherein the first etching process includes a first set of etching parameters, the second etching process includes a second set of etching parameters different from the first set of etching parameters, and wherein each of the first etching process and the second etching process is one of reactive ion etching (RIE) or ion beam etching (IBE).

4. The method of claim 1, wherein the step of etching the magnetoresistive stack using the first etching process to form the one or more first sidewalls results in etched material being redeposited on the one or more first sidewalls of the magnetoresistive stack.

5. The method of claim 1, wherein the step of etching the magnetoresistive stack using the first etching process to form the one or more second side walls results in the etched material being redeposited on the one or more second sidewalls of the magnetoresistive stack.

6. The method of claim 1, further including depositing a second encapsulant on the magnetoresistive stack after etching the magnetoresistive stack using the second etching process.

7. The method of claim 1, wherein etching the magnetoresistive stack using the first etching process to form the one or more first sidewalls includes terminating the first etching process prior to etching the magnetically fixed region of the magnetoresistive stack.

8. The method of claim 1, wherein etching the magnetoresistive stack using the first etching process to form the one or more first sidewalls includes terminating the first etching process prior to etching at least one of the magnetically fixed region, the magnetically free region, or the intermediate region of the magnetoresistive stack.

9. The method of claim 1, wherein the first etching process is at least one of: time-controlled or endpoint-controlled.

10. The method of claim 1, further including etching the magnetoresistive stack using the second etching process, after forming the one or more first sidewalls and before depositing the first encapsulant on the magnetoresistive stack, wherein the second etching process removes at least a portion of etched material redeposited on the one or more first sidewalls.

11. The method of claim 1, wherein the first encapsulant comprises an electrically non-conductive material.

12. A method of fabricating a magnetoresistive device including a magnetoresistive stack with at least an intermediate region formed between a magnetically fixed region and a magnetically free region, comprising:
    etching a first portion of the magnetoresistive stack using a first etching process to form one or more first sidewalls;
    terminating the first etching process prior to etching at least one of the magnetically fixed region, the magnetically free region, or the intermediate region of the magnetoresistive stack;
    etching a second portion of the magnetoresistive stack using a second etching process after forming the one or more first sidewalls, wherein the second etching process is relatively more isotropic than the first etching process;
    depositing a first encapsulant on the magnetoresistive stack before the step of etching the second portion of the magnetoresistive stack using the second etching process; and
    etching a third portion of the magnetoresistive stack using the first etching process to form one or more second sidewalls, after the step of depositing the first encapsulant and before the step of etching the second portion of the magnetoresistive stack using the second etching process.

13. The method of claim 12, wherein both the first etching process and the second etching process is one of reactive ion etching (RIE) or ion beam etching (IBE).

14. The method of claim 12, wherein the first etching process includes a first set of etching parameters, the second etching process includes a second set of etching parameters different from the first set of etching parameters, and wherein each of the first etching process and the second etching process is one of reactive ion etching (RIE) or ion beam etching (IBE).

15. The method of claim 12, wherein the step of etching the first portion of the magnetoresistive stack using the first etching process results in etched material being redeposited on the one or more first sidewalls of the magnetoresistive stack.

16. The method of claim 12, wherein the step of etching the third portion of the magnetoresistive stack using the first etching process results in etched material being redeposited on the one or more second sidewalls of the magnetoresistive stack, and
   wherein the step of etching the second portion of the magnetoresistive stack using the second etching process includes removing at least a portion of the redeposited material from the one or more second sidewalls.

17. The method of claim 12, further including depositing a second encapsulant on the magnetoresistive stack after etching the second portion of the magnetoresistive stack using the second etching process.

18. The method of claim 12, wherein the first etching process is terminated prior to etching the magnetically fixed region of the magnetoresistive stack.

19. The method of claim 12, further including etching a fourth portion of the magnetoresistive stack using the second etching process, after forming the one or more first sidewalls and before the step of depositing the first encapsulant, wherein the fourth portion of the magnetoresistive stack comprises at least in part etched material redeposited on the one or more first sidewalls.

20. The method of claim 12, wherein the first encapsulant comprises an electrically non-conductive material.

* * * * *